United States Patent [19]

Gould et al.

[11] 4,232,398
[45] Nov. 4, 1980

[54] RADIO RECEIVER ALIGNMENT INDICATOR

[75] Inventors: Larrie A. Gould, Arlington; Kim W. Reed, Fort Worth, both of Tex.

[73] Assignee: Motorola, Inc., Schaumburg, Ill.

[21] Appl. No.: 876,386

[22] Filed: Feb. 9, 1978

[51] Int. Cl.³ .............................................. H04B 1/06
[52] U.S. Cl. .................................... 455/226; 455/67; 455/154
[58] Field of Search .............. 325/365, 364, 452, 453, 325/455, 457, 67; 334/86

[56] References Cited

U.S. PATENT DOCUMENTS

| | | | |
|---|---|---|---|
| 3,273,065 | 9/1966 | Stover | 325/67 |
| 3,486,112 | 12/1969 | Bayer | 325/363 |
| 3,487,313 | 12/1969 | Cushman et al. | 324/74 D |
| 3,506,915 | 4/1970 | Harris | 325/363 |
| 3,564,420 | 2/1971 | Webb | 325/363 |
| 3,628,151 | 12/1971 | Roeder | 325/363 |
| 3,631,346 | 12/1971 | Riggs | 325/363 |
| 3,875,328 | 4/1975 | Gibson et al. | 325/363 |

Primary Examiner—John C. Martin
Assistant Examiner—Tommy P. Chin
Attorney, Agent, or Firm—Sang Ki Lee; James W. Gillman

[57] ABSTRACT

A predetermined frequency alignment signal and a white noise source signal are alternately switched through the intermediate frequency amplifier stage (IF) of the receiver being aligned. A series connected integrating capacitor and tuning meter couple between the receiver's detector output and ground potential.

In operation, during the interval of white noise being applied to the IF the tuning meter is shorted and the capacitor is charged to a net voltage $V_n$ which is representative of the center frequency of the IF. When the alignment signal is applied to the IF, the tuning meter short is removed and a signal $V_s$ appears across the capacitor-meter circuit, whereby the meter reading is indicative of $V_s - V_n$ which represents relative receiver alignment.

2 Claims, 3 Drawing Figures

RADIO RECEIVER ALIGNMENT INDICATOR

BACKGROUND OF THE INVENTION

The present invention pertains to the radio receiver art and, more particularly, to a means for, and a method of aligning a radio receiver.

The radio receiver art has developed several techniques for the aligning of radio receivers. Alignment is a process whereby various stages of the receiver are properly tuned to the desired frequency. For example, when a modulated signal of predetermined carrier frequency is applied to the radio frequency input stage of a receiver, the local oscillator stage, tuned intermediate frequency stage, and detector stage must all be adjusted to maximally reproduced the signal at the (or demodulator in FM radio receiver) detector output.

A typical alignment procedure known in the prior art is as follows. A predetermined frequency signal is applied to the radio frequency input, or antenna connection, of the receiver being aligned. The local oscillator is adjusted such that the output from the mixer is the input signal converted to the receivers intermediate frequency which, in a common FM radio is 10.7 MHz. The intermediate frequency stage is then adjusted such that the alignment signal is directly in the center of its passband. For receivers employing a fixed tuned IF stage, however, the receiver may be misaligned due to the center band of the filter being at other than the derived intermediate frequency. This results in misalignment. Finally, a DC tuning meter is connected to the output from the detector stage and the detector is adjusted such that the output reading is zero volts DC. Also, due to component value drifts caused by aging and thermal effects, a reading of zero volts DC may, in fact, correspond to a misaligned receiver.

The above described prior art alignment procedure suffers from numerous disadvantages. Firstly, it is a complicated and tedious procedure, not generally suited to efficient manufacturing operation. Also, for receivers employing fixed intermediate frequency tuned stages, the above procedure does not provide optimum alignment. In addition, it is desirable for purposes such as field alignment to use a zero centered DC tuning meter. For radio designs utilizing a quadrature detector, a non zero DC output signal appears at the detector when the detector is properly aligned. This fact precludes the use of zero centered DC tuning indicators when used in the prior art aligning procedure.

SUMMARY OF THE INVENTION

It is an object of this invention, therefore, to provide a simple, efficient and precise method for the aligning of a radio receiver.

It is a further object of the invention to provide an improved means for indicating the relative degree of receiver alignment.

Briefly, according to the invention, an FM radio frequency receiver having a tuned intermediate frequency stage (IF) followed by a detector stage may be aligned by first alternately applying a noise signal and then a predetermined frequency signal to the IF stage. The receiver is then adjusted such that the output of the detector stage responsive to the applied noise signal bears a predetermined relationship to the detector stage output responsive to the applied predetermined frequency signal. Preferably, the frequency of the receiver's local oscillator is adjusted until the voltage at the detector output is the same whether the noise signal or the predetermined frequency signal is applied.

The means for indicating receiver alignment includes a signal generator for generating a predetermined frequency alignment signal, a noise source for generating a random noise signal and a switching means which alternately couples the predetermined frequency alignment signal and the noise signal to the receiver's intermediate frequency stage. A comparator compares the output of the detector stage responsive to the predetermined frequency alignment signal being coupled to the IF stage with the output of the detector responsive to the noise signal being applied to the IF stage. An error signal is produced indicative to the tuning of the receiver stage with respect to the predetermined frequency alignment signal. Preferably, the comparator comprises a capacitor which has one terminal coupled to the output of the detector and the other terminal coupled through a meter to reference, or ground potential. The switching means further includes a means which short circuits the meter during the time that one of the predetermined frequency alignment signal and noise signal is applied to the IF stage. In this manner, the fluctuation of the meter is indicative of the difference between the magnitudes of the detector stage outputs corresponding to the predetermined frequency alignment signal and the noise signal being coupled to the IF stage and, thus, is indicative of the relative alignment of the radio receiver.

DETAILED DESCRIPTION OF THE PREFERRED EMBODIMENT OF THE INVENTION

Figure 1:
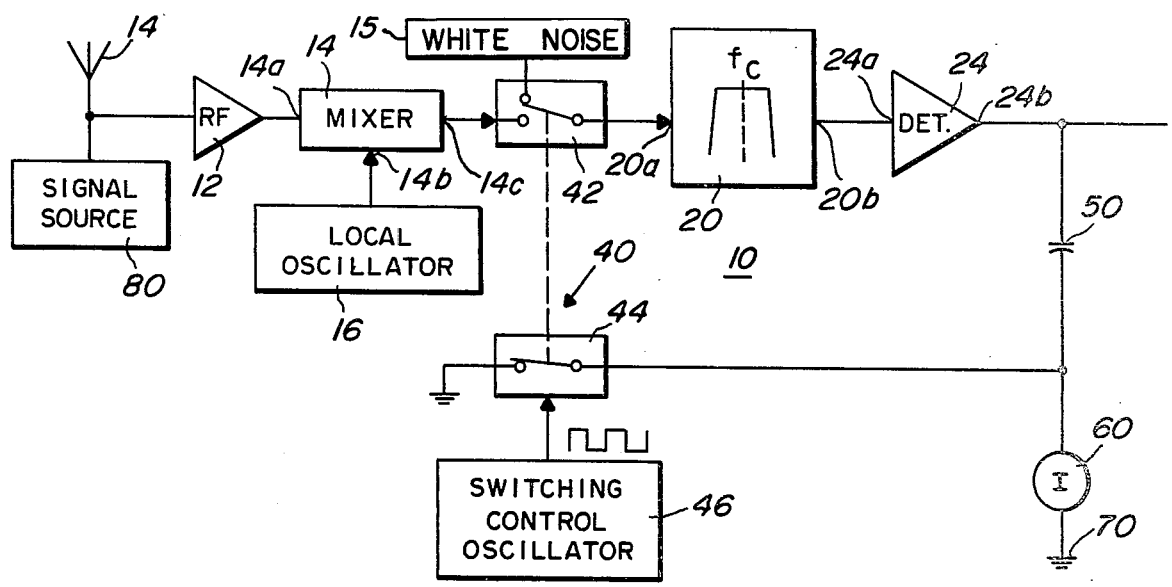
FIG. 1 is a block diagram illustrating the basic structure and operation of the preferred embodiment of the invention.

FIG. 1 illustrates, in block diagram form, a conventional FM radio receiver, indicated generally at 10 in combination with the preferred embodiment of the alignment indicator. The receiver is comprised of a conventional RF input stage 12 adapted for receiving signals from an antenna 14. The output from the RF stage 12 feeds to the first input 14a of a conventional mixer circuit 14. Applied to the second input 14b of mixer stage 14 is the output from the local oscillator stage 16. Local oscillator stage 16 is of conventional design, and is tunable over a defined range suitable for converting the signal received at the mixer first input 14a to the intermediate frequency of the receiver.

The converted output appearing at the mixer output 14c is coupled through switch 42 to the input 20a of a conventional tuned intermediate frequency stage (IF) 20. Intermediate frequency stage 20 is of standard design employing circuits having tuned characteristics about a center frequency $f_c$. In a typical FM radio receiver, $f_c$ is selected to be 10.7 MHz. The filtered, amplified and limited signal from IF stage 20 appears at the stages output 20b and passes to the input 24a of a conventional detector stage 24. Acting in the known manner, the detector 24 which produces an output signal representative of the frequency change of signals applied to it, recovers the information, e.g. audio signal, contained in the input RF signal, reproducing this information signal at its output terminal 24b.

The alignment indicating circuitry, according to the preferred embodiment of the invention, includes switching means, indicated generally at 40, which includes a first switch 42, coupled between the mixer output 14c and the IF input 20a, a second switch 44 and a switching control oscillator 46. Each switch 42, 44 is of the single pole/single throw type and responds to control signals generated by switching control oscillator 46 to appropriately either short, or open its contacts. Thus, the switches 42, 44 may be comprised of relays or, preferably, suitable semiconductor devices such as bipolar transistors. In this, the preferred embodiment of the invention, the two switches 42, 44 are connected 180° out of phase, such that when one switch is open, the other is closed.

A series connected integrating capacitor 50 and tuning meter 60 are coupled between the detector output 24b and reference, or ground potential 70. As will be understood more fully hereinbelow, capacitor 50 is of selected value to integrate the signals alternately applied to it as a result of the switching means 40.

Tuning meter 60 is of conventional design, reading center scale with zero volts DC applied to it. In this, the preferred embodiment of the invention, tuning meter 60 is selected to be deflected full scale, in either direction, with an applied current of 25 microamps.

The method of aligning a radio receiver according to the instant invention, and operation of the means for indicating receiver alignment, may be understood as follows. A signal source 80 is coupled to the input of the RF stage 12. The signal source 80 is adjusted to generate a predetermined frequency alignment carrier. The alignment carrier signal is converted, via the operation of mixer 14 and local oscillator 16, to the intermediate frequency whereby the converted signal appears at the mixer output 14c. In its first mode of operation, that is when its contacts are shorted together, switch 42 couples the converted alignment signal through the IF stage 20 and detector stage 24 whereby the output from the detector responsive to the applied alignment signal appears at the detector output 24b. When switch 42 is in its second mode of operation, i.e. its contacts being open circuited, a random, white noise signal appears at the input 20a of the IF stage 20. It is commonly known to one of ordinary skill in the art that the input 20a of IF stage 20 will contain white noise when open circuited. An alternate method of applying white noise to the IF stage would be to inhibit operation of the local oscillator stage 16 or to open circuit the RF stage 12 input. A further way to apply white noise to the IF stage 20 would be to switch the IF stage input 20a directly to a white noise source, such sources being commercially available and shown diagrammatically by the box 15 in FIG. 1.

During the period that switch 42 is in its second mode and white noise is applied through the IF stage 20 and detector stage 24, switch 44 is closed thereby shorting out the tuning meter 60. Thus, in this mode, capacitor 50 integrates the processed noise signal through the IF 20 and detector stage 24. Assuming a symmetric detector stage 24, the net, integrated voltage appearing at the detector output 24b during this second mode opertion of switch 42 charges capacitor 50 to a voltage $V_n$. This voltage is directly representative of the center frequency of the IF stage 20.

With switch 42 in its first mode, the converted alignment signal is applied through the IF stage 20 and detector stage 24 thereby producing an output signal $V_s$. This voltage appears directly across both the capacitor 50 and tuning meter 60 since, in this mode, switch 44 is open circuited. Thus, the voltage appearing across tuning meter 60 is equal to $V_s-V_n$ which is a differential error voltage representative of the difference between the outputs of detector 24 resulting from application of the white noise signal and the predetermined frequency alignment signal.

Since the integrated noise signal $V_n$ is representative of the center frequency of the IF 20 and detector 24, deviations of the alignment signal from the center frequency of IF 20 and detector 24 will produce an output signal $V_s$ differing in magnitude from that of the noise signal $V_n$. Thus, meter 60 will deflect to indicate magnitude of misalignment of the receiver as well as an indication of whether the receiver is tuned above or below the alignment signal. Thus, the receiver may be aligned as, for example, by adjusting local oscillator 16 such that the reading on meter 60 is a zero volts DC.

Figure 2A:
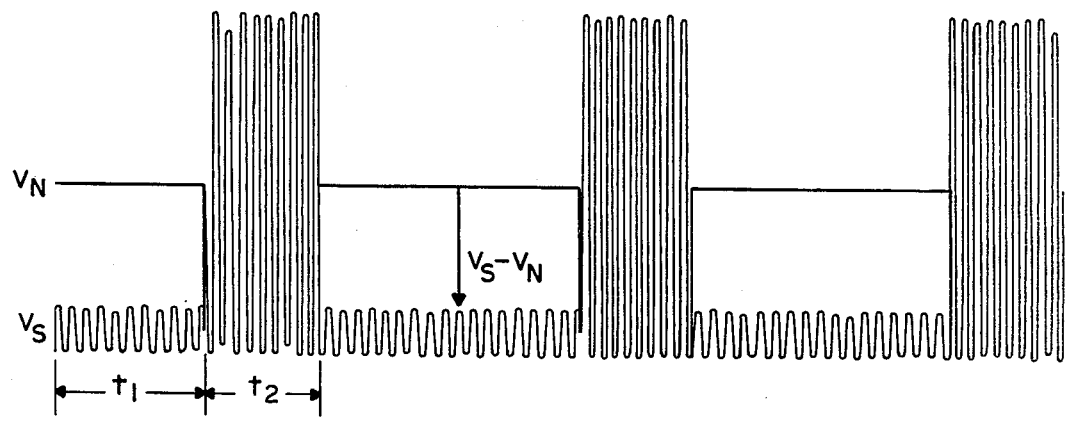
FIG. 2 shows a series of waveforms representative of operation of the preferred embodiment shown in FIG. 1.

FIG. 2 illustrates representative wave forms appearing at the output 24b of detector 24 during operation of the alignment method. Here, the time $t_1$ is representative of the time during which the first switch 42 is in its first mode or closed state of operation (6 milliseconds in the preferred embodiment of the invention) with the time $t_2$ representative of switch 42 being in its second mode or open state of operation (2 milliseconds in the preferred embodiment of the invention). Thus, referring to FIG. 2a, which is representative of the alignment frequency signal being at a frequency below the center of the IF 20 passband, during the time $t_1$ capacitor 50 is charged to the voltage $V_s$. Then, during time interval $t_2$, white noise is fed through IF 20 and the meter circuit 60 is shorted. This produces a noise voltage, which is centered about $V_n$. The difference between the two signals $V_s-V_n$ is a net negative voltage which drives meter 60 of FIG. 1 in the negative direction.

Figure 2B:
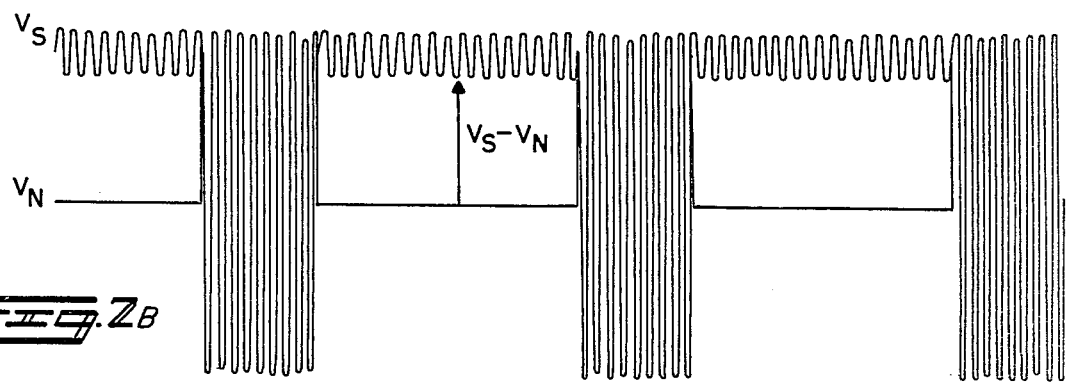

In FIG. 2b, the alignment signal is at a frequency above the center passband of IF 20 and detector 24. Here, the net error signal $V_s-V_n$ is positive, which drives meter 60 to a positive reading.

The capacitor 50 and the meter 60 comprise a comparator means for comparing the output of the detector 24 under the two conditions of operation.

By adjusting the duty cycle of time periods $t_1$ and $t_2$ the reading of meter 60 may be calibrated in terms of frequency of misalignment, in hertz per unit of voltage error.

In addition, by proper selection of the capacitor 50, the sampling rate, the duty cycle and the mechanical dempening of the meter 60, the meter assumes as table reading indicative of receiver alignment.

In summary, the method of aligning a radio receiver, according to the instant invention, may be efficiently performed while maintaining a high degree of precision.

The means for indicating the degree of receiver misalignment, according to the invention is precise, and inexpensive to implement. Further, for receivers employing detectors which inherently have a DC offset at the output 24b, such as quadrature detectors, the instant indicator means allows a zero center DC meter to be employed due to the DC blocking action of capacitor 50.

While a preferred embodiment of the invention has been described in detail, it should be apparent to many modifications and variations thereto are possible, all of which fall within the true spirit and scope of the invention.

For example, whereas in the instant embodiment of the invention an alignment signal was converted through the mixer before being applied to the IF stage, it should be apparent that an alignment signal could be applied directly to the IF input and the receiver aligned accordingly.

We claim:

1. Indicator means for indicating the relative alignment of an FM radio receiver, having a tuned intermediate frequency (IF) stage followed by a detector stage, which detector stage produces an output representative of the change in frequency of a signal applied at its input, comprising:
   signal generator means for generating a predetermined frequency alignment signal and a noise source means for generating a random noise signal;
   switching means for alternately coupling, at a predetermined rate, the predetermined frequency alignment signal and the noise signal to said IF stage; and
   comparator means for comparing the output of said detector stage responsive to the predetermined frequency alignment signal being coupled to the IF stage with the output of said detector stage responsive to the noise signal being applied to said IF stage and producing an error signal indicative of the tuning of said IF stage with respect to said predetermined frequency alignment signal.

2. The indicator means of claim 1 wherein the comparator means comprises:
   capacitor means, of predetermined value, having one terminal coupled to the output of said detector;
   meter means, for indicating the magnitude of said error signal, coupled between the free end of said capacitor and a reference potential; and
   wherein said switching means further comprises:
   means for short circuiting said meter means during the time that noise signal is coupled to said IF stage and for open circuiting said meter means during the time that said predetermined frequency alignment signal is coupled to said IF stage,
   whereby the deflection of said meter is indicative of the difference between the magnitudes of the detector stage outputs corresponding to the predetermined frequency alignment signal and the noise signal being coupled to said IF stage.

* * * * *

UNITED STATES PATENT AND TRADEMARK OFFICE
CERTIFICATE OF CORRECTION

PATENT NO. : 4,232,398
DATED : NOVEMBER 4, 1980
INVENTOR(S) : LARRIE A. GOULD and KIM W. REED It is certified that error appears in the above—identified patent and that said Letters Patent is hereby corrected as shown below:

Col. 1, line 16 and 17 should read --to maximally reproduce the signal at the detector (or demodulator in FM radio receiver) output.--.

Col. 2, line 14, "to" should be --of--.

Signed and Sealed this

Fourteenth Day of April 1981

[SEAL]

Attest:

RENE D. TEGTMEYER

Attesting Officer    Acting Commissioner of Patents and Trademarks